(12) United States Patent
Kang et al.

(10) Patent No.: US 7,579,243 B2
(45) Date of Patent: Aug. 25, 2009

(54) SPLIT GATE MEMORY CELL METHOD

(75) Inventors: Sung-Taeg Kang, Austin, TX (US);
Rode R. Mora, Austin, TX (US);
Robert F. Steimle, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 522 days.

(21) Appl. No.: 11/535,345

(22) Filed: Sep. 26, 2006

(65) Prior Publication Data

US 2008/0076221 A1    Mar. 27, 2008

(51) Int. Cl.
*H01L 21/336* (2006.01)
*H01L 21/3205* (2006.01)
(52) U.S. Cl. .................. 438/267; 438/304; 438/596
(58) Field of Classification Search .................. 438/305, 438/267; 257/326, E21.681, E21.69
See application file for complete search history.

(56) References Cited

U.S. PATENT DOCUMENTS

| | | | |
|---|---|---|---|
| 5,408,115 A | 4/1995 | Chang | |
| 5,824,584 A * | 10/1998 | Chen et al. | 438/267 |
| 6,768,681 B2 | 7/2004 | Kim | |
| 6,800,526 B2 | 10/2004 | Lin et al. | |
| 6,960,527 B2 | 11/2005 | Kang | |
| 2003/0223299 A1 | 12/2003 | Wen et al. | |
| 2006/0001077 A1 * | 1/2006 | Ryu et al. | 257/315 |
| 2007/0218633 A1 * | 9/2007 | Prinz et al. | 438/267 |

* cited by examiner

*Primary Examiner*—Ha Nguyen
*Assistant Examiner*—Valerie Brown
(74) *Attorney, Agent, or Firm*—Kim-Marie Vo; James L. Clingan, Jr.

(57) ABSTRACT

Split gate memory cell formation includes forming a sacrificial layer over a substrate. The sacrificial layer is patterned to form a sacrificial structure with a first sidewall and a second sidewall. A layer of nanocrystals is formed over the substrate. A first layer of polysilicon is deposited over the substrate. An anisotropic etch on the first polysilicon layer forms a first polysilicon sidewall spacer adjacent the first sidewall and a second polysilicon sidewall spacer adjacent the second sidewall. Removal of the sacrificial structure leaves the first sidewall spacer and the second sidewall spacer. A second layer of polysilicon is deposited over the first and second sidewall spacers and the substrate. An anisotropic etch on the second layer of polysilicon forms a third sidewall spacer adjacent to a first side of the first sidewall spacer and a fourth sidewall spacer adjacent to a first side of the second sidewall spacer.

20 Claims, 11 Drawing Sheets

US 7,579,243 B2

SPLIT GATE MEMORY CELL METHOD

FIELD OF THE INVENTION

This invention relates generally to semiconductor devices, and more specifically, to semiconductor devices having control and select gates.

BACKGROUND

In the field of CMOS (complementary metal-oxide semiconductor) fabrication, split gates semiconductor devices are formed having control and select gates. Current lithography processes used to form the control and select gates lead to misalignment of the gates, which results in undesirable threshold voltage distributions. Furthermore, the lithography processes used require three lithography processes to form the two gates. For each lithography process, a different mask is needed. This increases costs and the repeated steps increase manufacturing cycle time. Thus, a process for preventing these adverse effects when forming split gates having control and select gates is desired.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
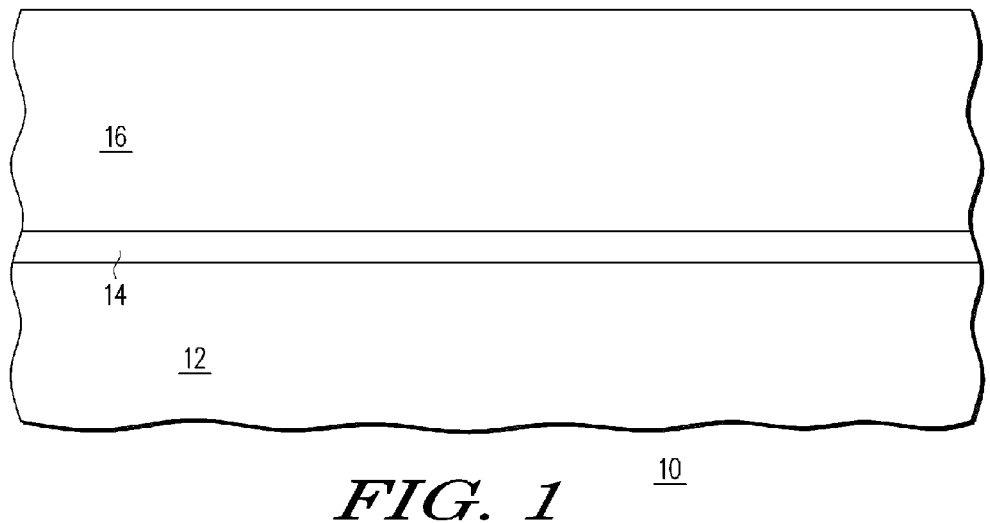
FIG. 1 illustrates a cross section of a portion of a semiconductor device including a substrate, a dielectric layer, and a nitride layer in accordance with one embodiment of the present invention.

FIG. 1 illustrates a cross section of a portion of a semiconductor device 10 including a substrate 12, a dielectric layer 14, and a nitride layer 16. The semiconductor substrate 12 can be any semiconductor material or combinations of materials, such as gallium arsenide, silicon germanium, silicon-on-insulator (SOI) (e.g., fully depleted SOI (FDSOI)), silicon, monocrystalline silicon, the like, and combinations of the above. The dielectric layer 14 may be any suitable oxide. In one embodiment, the dielectric layer 14 is a silicon dioxide layer. The dielectric layer 14 can be formed by any suitable process such as thermal growth, chemical vapor deposition (CVD), atomic layer deposition (ALD), physical vapor deposition (PVD), the like, or combinations of the above. The dielectric layer 14 in one embodiment is a pad oxide layer. The dielectric layer 14 is formed so that the overlying nitride layer 16 can be formed on the semiconductor substrate 12 without negative effects such as dislocations being formed in the semiconductor substrate 12. The nitride layer 16 can be any nitride layer, such as a silicon nitride (e.g., stoichiometric nitride or a silicon-rich silicon nitride.) The nitride layer 16 can be formed by any suitable process such as CVD, ALD, PVD, the like, or combinations of the above. In one embodiment, the dielectric layer 14 is approximately 150 Angstroms thick and the nitride layer 16 is approximately 1,500-approximately 2000 Angstroms thick. As will become apparent after further discussion, the nitride layer is a sacrificial layer.

Figure 2:
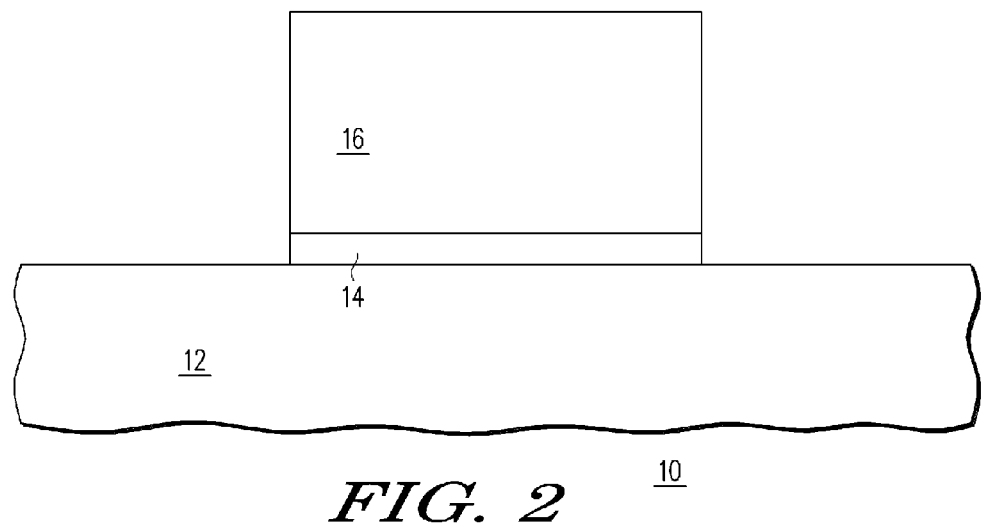
FIG. 2 illustrates the semiconductor device of FIG. 1 after patterning the dielectric layer and the nitride layer in accordance with one embodiment of the present invention.

FIG. 2 illustrates the semiconductor device 10 of FIG. 1 after patterning the dielectric layer 14 and the nitride layer 16. Any suitable process can be used. For example, a photoresist layer (not shown) can be formed and patterned over the nitride layer 16. A wet or dry etch can then be used to pattern the dielectric layer 14 and the nitride layer 16. In one embodiment, a dry etch using a fluorine-containing chemistry (e.g., $CH_3/FO_2$ or $CF_4/HBr$) or any other suitable chemistry. As a skilled artisan should recognize, the width of the remaining dielectric layer 14 and the nitride layer 16 depends on the technology node of the semiconductor device 10. However, the width should be large enough for a select gate(s) and a contact to be formed within this distance, as will become apparent after further processing since the nitride layer 16 is removed and select gate(s) are formed within the area once occupied by the nitride layer 16. Thus, the nitride layer 16 after being patterned is a sacrificial structure with a first sidewall and a second sidewall.

Figure 3:
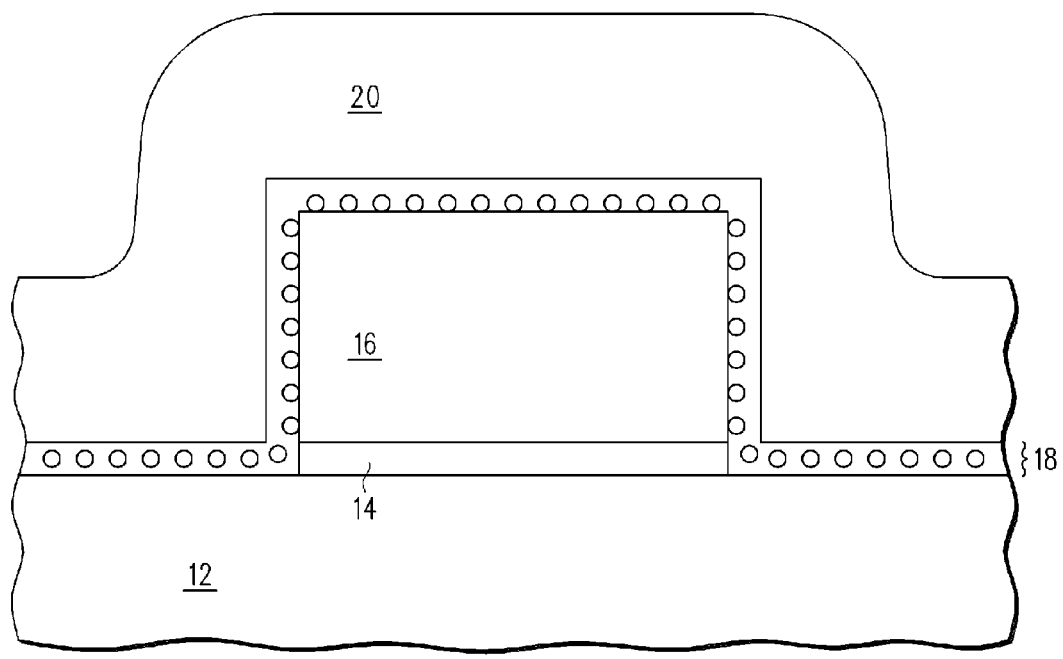
FIG. 3 illustrates the semiconductor device of FIG. 2 after forming a charge storage layer and a first conductive layer in accordance with one embodiment of the present invention.

As shown in FIG. 3, after patterning the dielectric layer 14 and the nitride layer 16, a charge storage layer 18 and a first conductive layer 20 are formed over the semiconductor device 10. In the embodiment illustrated, the charge storage layer 18 includes a tunnel dielectric, discrete storage devices (e.g., nanocrystals), and a control dielectric. The tunnel dielectric and the control dielectric can be any suitable dielectric, such as silicon dioxide, and can be formed by any process, such as thermal growth. If the tunnel dielectric is formed by thermal growth, the tunnel dielectric will not form over the nitride layer 16 and thus, as shown in FIG. 3, the discrete storage devices are formed in contact with the nitride layer 16. The discrete storage devices can be any suitable material, such as a semiconductor material (e.g., silicon). In one embodiment, the tunnel dielectric (when present) is approximately 50-approximately 70 Angstroms thick, the nanocrystals density is approximately $1 \times 10^{11}$ to approximately $1 \times 10^{12}$ nanocrystals per cm squared and each have a diameter of approximately 70-approximately 200 Angstroms, and the control dielectric is approximately 80-approximately 140 Angstroms thick. The first conductive layer 20 can be polysilicon, amorphous silicon, a material including a metal, the like, or combinations of the above, and can be formed by any suitable process such as CVD, ALD, PVD, the like, and combinations of the above. In one embodiment, the first conductive layer 20 is approximately 1,500-approximately 2,000 Angstroms thick.

Figure 4:
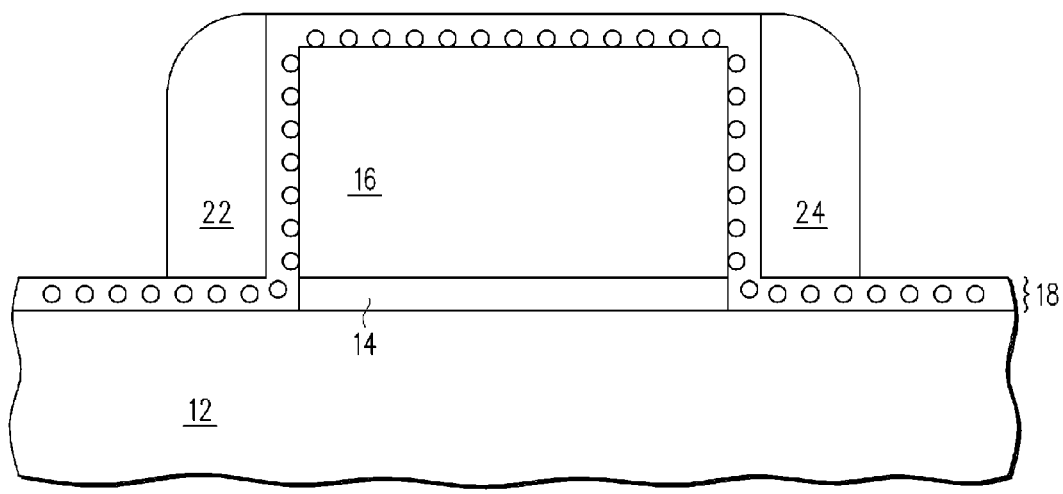
FIG. 4 illustrates the semiconductor device of FIG. 3 after patterning the first conductive layer to form first gates in accordance with one embodiment of the present invention.

FIG. 4 illustrates the semiconductor device 10 of FIG. 3 after patterning the first conductive layer 20 to form first gates 22 and 24. In the embodiment illustrated in FIG. 4, the first gates 22 and 24 are control gates; the charge storage layer is underneath them. In addition, the first gates 22 and 24 are sidewall spacers. To form the first gates 22 and 24, an anisotropic etch can be used that is selective to the exposed portions of the charge storage layer 18. For example, the etch should be selective to silicon dioxide if this is the material used for the control dielectric of the charge storage layer 18. If the first conductive layer 20 includes silicon (e.g. the first conductive layer is polysilicon or amorphous silicon) and the top of the charge storage layer 18 includes silicon dioxide, chlorine based chemistry, such as $Cl_2$—HBR—$HeO_2$—$CF_4$, can be used. This chemistry is desirable because it will not etch the silicon dioxide of the charge storage layer and thus, the chemistry etches the first conductive layer 20 selective to the charge storage layer 18. If instead the first conductive layer 20 is TiN and the top layer of the charge storage layer 18 is silicon dioxide, a chemistry such as $Cl_2$—$BCl_3$—Ar can be used. This chemistry is desirable because the chemistry will etch the first conductive layer 20 selective to the charge storage layer 18. The width of the first gates 22 and 24 is a function of the thickness of the first conductive layer 20 from which the first gates 22 and 24 are formed.

Figure 5:
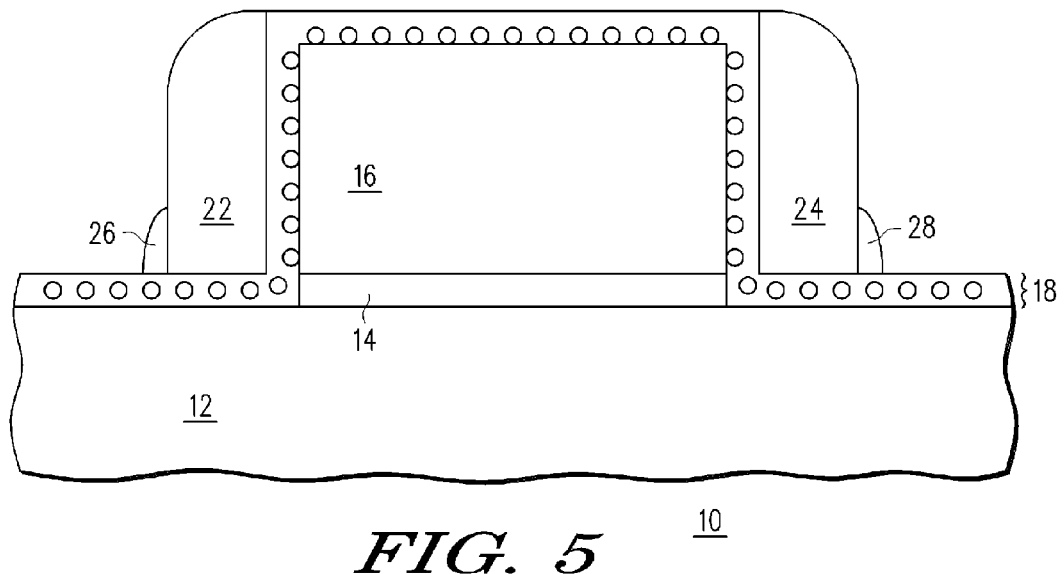
FIG. 5 illustrates the semiconductor device of FIG. 4 after forming spacers in accordance with one embodiment of the present invention.

FIG. 5 illustrates the semiconductor device 10 of FIG. 4 after forming spacers 26 and 28, which in one embodiment are nitride spacers. The spacers 26 and 28 can be formed by anisotropically etching a nitride layer that was previously deposited over the semiconductor device 10 using any suitable process such as CVD, ALD, PVD, the like, and combinations of the above. In one embodiment, the spacers 26 and 28 are silicon nitride spacers. In one embodiment, the deposited nitride layer that was previously deposited was approximately 200 Angstroms thick. As will become apparent after further discussion, the spacers 26 and 28 are used to prevent undercutting of the first gates 22 and 24. However, if the process is controlled so that undercutting is prevented or minimized or any undercutting is acceptable, the spacers 26 and 28 may not be formed.

Figure 6:
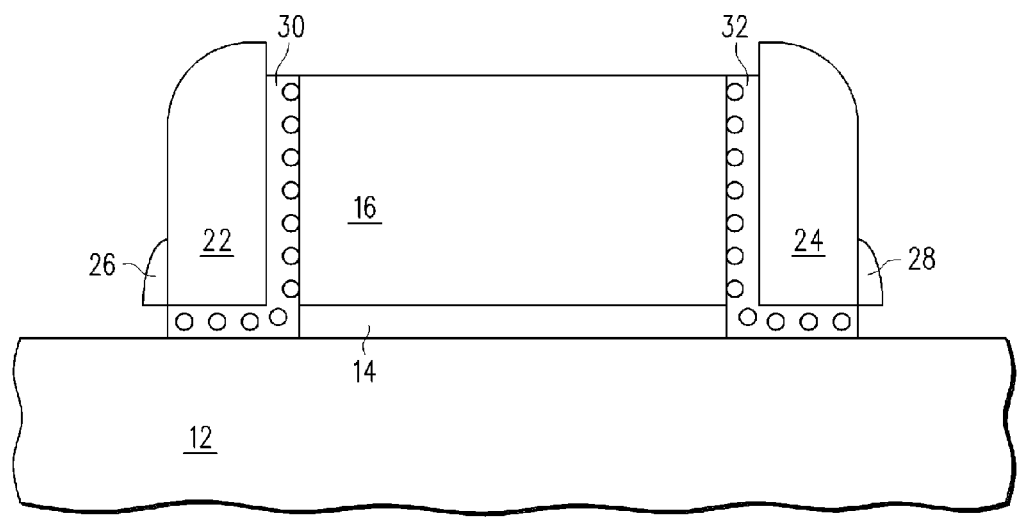
FIG. 6 illustrates the semiconductor device of FIG. 5 after removing portions of the charge storage layer to form remaining portions of the charge storage layer in accordance with one embodiment of the present invention.

FIG. 6 illustrates the semiconductor device 10 of FIG. 5 after removing portions of the charge storage layer 18 to form remaining portions of the charge storage layer 30 and 32. In one embodiment, portions of the charge storage layer 30 are removed using an HF wet etch with an SC-1 megasonic clean; the nitride layer 16 is resistant to the HF wet etch. However, in one embodiment, where the layer 16 is not a nitride layer and instead is another material, such as an oxide, a mask may be needed to protect the layer 16 during this charge storage layer 30 removal process. The remaining portions of the charge storage layer 30 are underneath the first gates 22 and 24 and along the substantially vertical sidewall of each of the first gates 22 and 24. If undercutting occurs (which is likely if the HF wet etch is used), the charge storage layer 18 is undercut under only the spacers 26 and 28 so as to remove all of the charge storage layer 18 under the spacers 26 and 28. However, a skilled artisan recognizes that the undercutting may also remove some of the charge storage layer under the first gates 22 and 24 or may not remove all of the charge storage layer under the spacers 28 and 26. While both are acceptable, it is preferable that some of the charge storage layer remain under the spacers 26 and 28 as opposed to undercutting the charge storage layer under the first gates 22 and 24. If the spacers 26 and 28 are not formed, the undercutting, if any, is likely to undercut the charge storage layer under the first gates 22 and 24.

Figure 7:
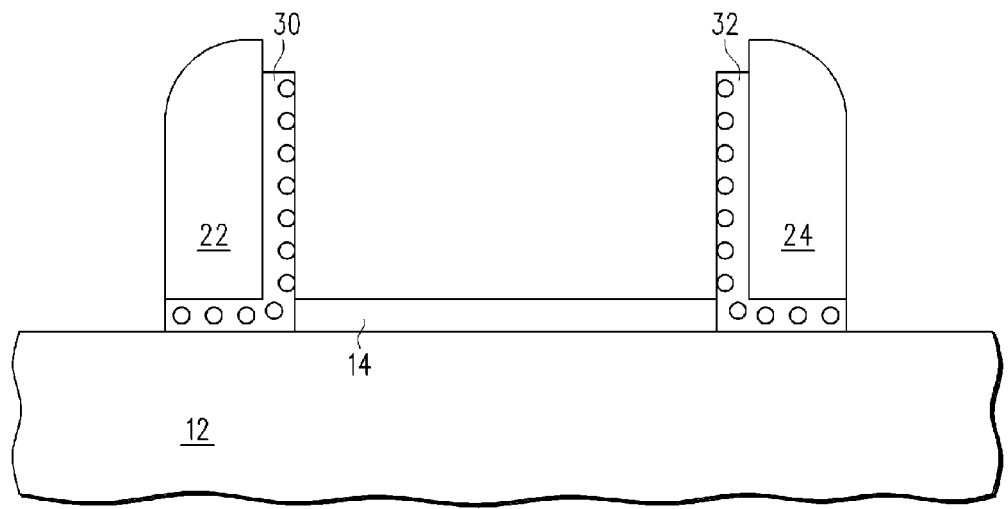
FIG. 7 illustrates the semiconductor device 10 of FIG. 6 or FIG. 4 after removing portions of the charge storage layer to form remaining portions of the charge storage layer and the spacers in accordance with one embodiment of the present invention.

FIG. 7 illustrates the semiconductor device 10 of FIG. 6 or FIG. 4 after removing portions of the charge storage layer 18 to form remaining portions of the charge storage layer 30 and 32 and, if present, the spacers 26 and 28. In the embodiment, where the spacers 26 and 28 are removed in FIG. 7, the removal may occur through an etch process. In one embodiment, the etch chemistry includes a dry isotropic etch with fluorine-containing chemistry or a wet etch, such as phosphoric acid.

Figure 8:
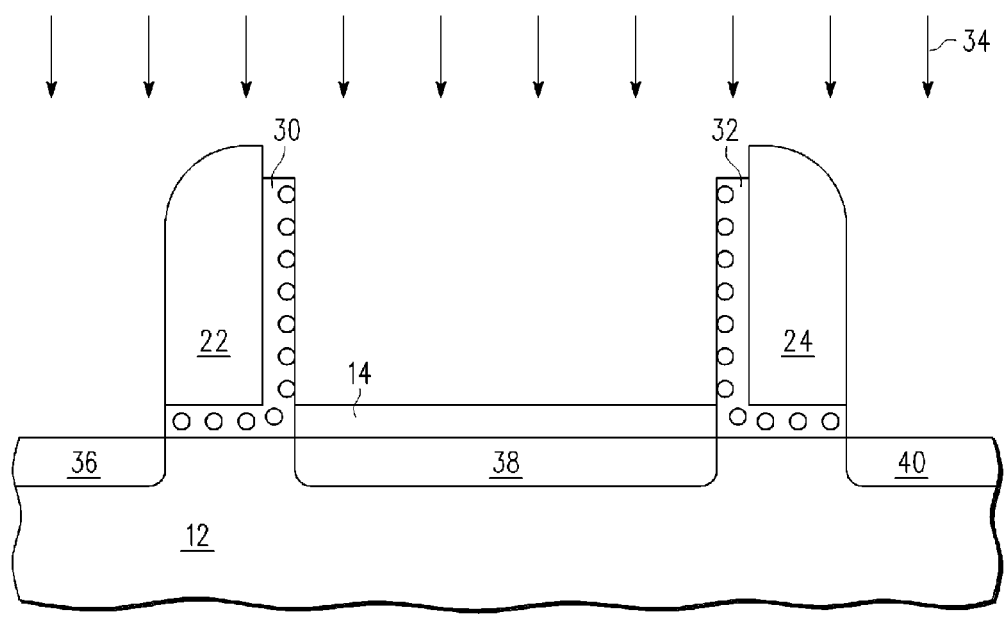
FIG. 8 illustrates the semiconductor device of FIG. 7 after forming an implant in accordance with one embodiment of the present invention.

FIG. 8 illustrates the semiconductor device 10 of FIG. 7 after forming an implant. In one embodiment, the implant 34 is a self-aligned implant to correct for threshold voltage adjustment for the select gate that subsequently is formed; hence, the implant 34 may be a threshold adjust implant. The implant 34 can be skipped, if desired. In one embodiment, the implant uses a boron or indium species with conventional well dosages. This implant 34 differentiates the doping of the select gate from the subsequently formed doping for the control gate, thus allowing the subsequently formed select gate and the control gate to have different threshold voltages. The implant results in regions 36, 38, and 40 being formed in the semiconductor substrate 12.

Figure 9:
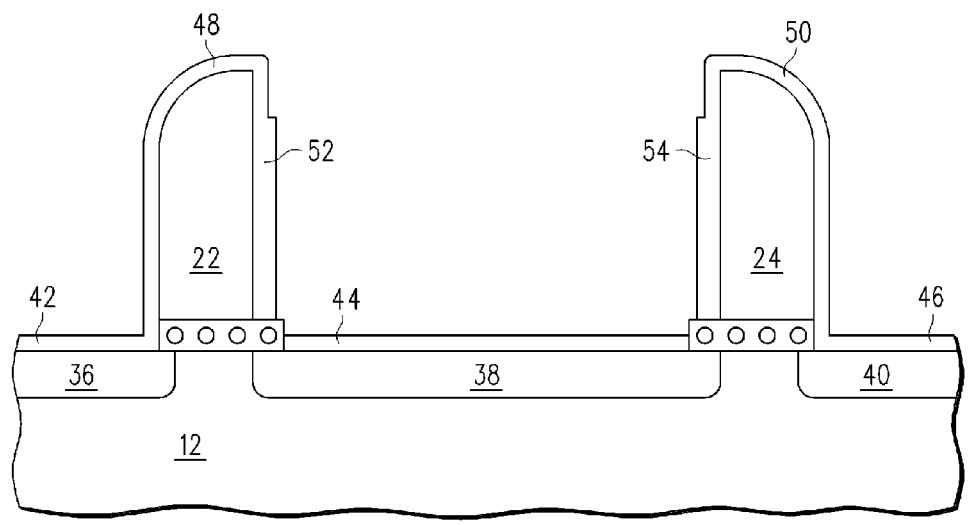
FIG. 9 illustrates the semiconductor device of FIG. 8 after forming a dielectric regions in accordance with one embodiment of the present invention.

FIG. 9 illustrates the semiconductor device 10 of FIG. 8 after forming dielectric regions 42, 44, 48, 52, 54, 50, and 46 of which region 44 is a gate dielectric layer. (A skilled artisan recognizes that if the implant in FIG. 8 is not performed, the regions 36, 38, and 40 will not be formed.) Before forming the gate insulating layer, the dielectric layer 14 is removed using conventional processing. When removing the dielectric layer 14 some of the remaining portions of the charge storage layer may be removed. More specifically, the exposed portions of the remaining portions of the charge storage layer may be removed. These exposed portions are the tunnel dielectric portions that are adjacent the vertical sidewall of the first gates 22 and 24. Because the tunnel dielectric may not be formed in this area since the tunnel dielectric may not be formed on the nitride layer that was previously present in this area when forming the tunnel dielectric, there may be little or no dielectric to remove from the remaining portions of the charge storage layer.

After removing the dielectric layer 14, another dielectric layer is formed over the semiconductor device 10 to form the gate dielectric layer 44 and the dielectric regions 42, 48, 52, 54, 50, and 46. In one embodiment, the dielectric layer formed is a thermally grown silicon dioxide layer. In this embodiment, the discrete storage devices in the charge storage layer may be oxidized and hence, they are removed from the area of the charge storage layer that is adjacent the vertical sidewall of the first gates 22 and 24 (regions 52 and 54). This is why regions 52 and 54 may be thicker than other regions such as regions 42, 48, 44, 50, and 46. Thus, when the charge storage layer 18 is formed, nanocrystals may be formed on the first and second sidewalls of the nitride layer 14 and forming the gate dielectric has the effect of removing the nanocrystals on the first sides of the first and second sidewalls of the nitride layer 14. In one embodiment, the regions 42, 48, 44, 50, and 46 are approximately 70-170 Angstroms thick. In one embodiment, the dielectric layer may be formed by any suitable process such as CVD, ALD, PVD, the like, or combinations of the above. During the formation of the dielectric layer, regions 36, 3, and 40 may expand.

Figure 10:
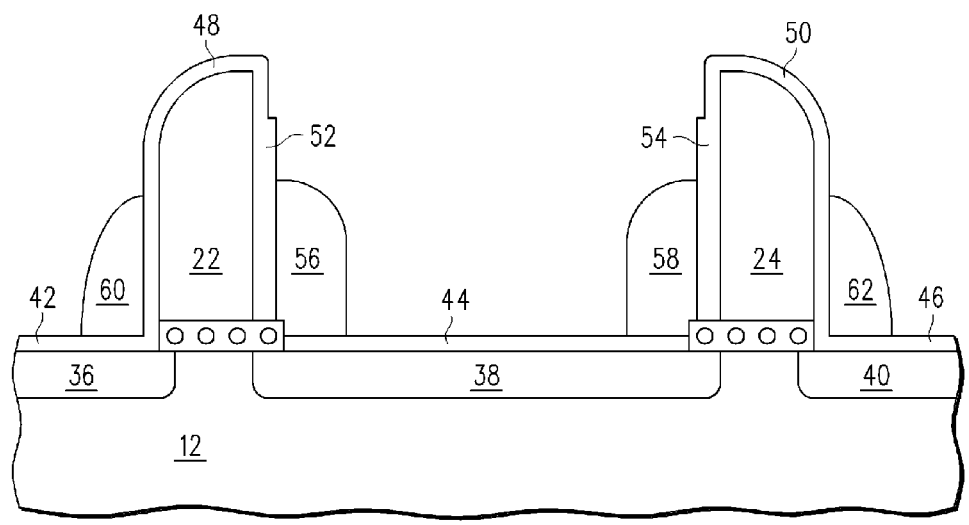
FIG. 10 illustrates the semiconductor device of FIG. 9 after forming second gates and spacers in accordance with one embodiment of the present invention.

FIG. 10 illustrates the semiconductor device 10 of FIG. 9 after forming second gates 56 and 58 and spacers 60 and 62. After forming the gate dielectric layer 44 (and the other dielectric regions 42, 48, 52, 54, 50, and 46), a second conductive layer (not shown) is formed over the semiconductor device 10. The second conductive layer can be polysilicon, amorphous silicon, a material including a metal, the like, or combinations of the above, and can be formed by any suitable process such as CVD, ALD, PVD, the like, and combinations of the above. In one embodiment, the second conductive layer is approximately 1,000-approximately 2,000 Angstroms thick. After forming the second conductive layer, the second conductive layer may be patterned to form the second gates 56 and 58. In the embodiment illustrated in FIG. 10, the second gates 56 and 58 are select gates. The second gates 56 and 58 are sidewall spacers. To form the second gates 56 and 58, an anisotropic etch can be used that is selective to the dielectric regions 42, 48, 52, 44, 54, 50, and 46. If the second conductive layer includes silicon (e.g. the second conductive layer is polysilicon or amorphous silicon) and dielectric layer includes silicon dioxide, a chlorine based chemistry, such as Cl—HBR—HeO$_2$—CF$_4$, can be used This chemistry is desirable because it will not etch the silicon dioxide. If instead the second conductive layer is TiN and the dielectric layer includes silicon dioxide, a chemistry such as Cl—BCl$_3$—Ar can be used. This chemistry is desirable because it will etch the second conductive layer selective to the dielectric layer. The width of the second gates 56 and 58 is a function of the thickness of the second conductive layer from which the second gates 56 and 58 are formed. During the formation of the second gates 56 and 58, the spacers 60 and 62 may be formed as part of the process even though spacers 60 and 62 are undesirable.

Figure 11:
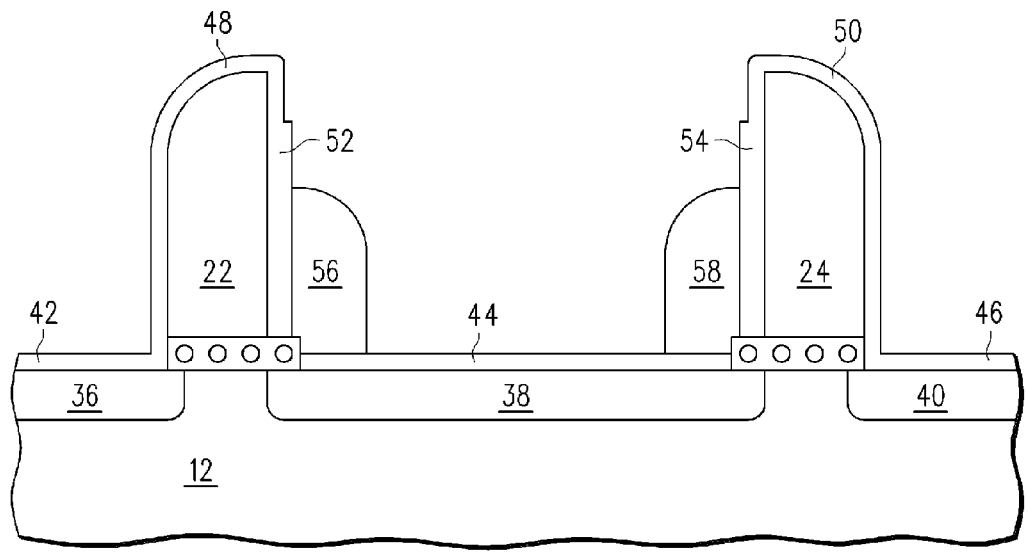
FIG. 11 illustrates the semiconductor device of FIG. 10 after removing the spacers in accordance with one embodiment of the present invention.

FIG. 11 illustrates the semiconductor device 10 of FIG. 10 after removing the spacers 60 and 62. In one embodiment, the spacers 60 and 62 are removed by covering at least the first gates 22 and 24 and second gates 56 and 58 (e.g., using a photoresist) and etching away the spacers 60 and 72. In one embodiment, the etch is a dry etch using a chemistry that can be the same type of etch chemistry used to form the spacers 60 and 72 and the second gates 56 and 58, but the powers and pressures are altered to make the etch isotropic. In another embodiment, a different isotropic etch can be used such as an etch chemistry including SF$_6$—HBr. Alternatively, a wet silicon etch can be used such as nitric acid with dilute HF; KOH; or TMAH.

Figure 12:
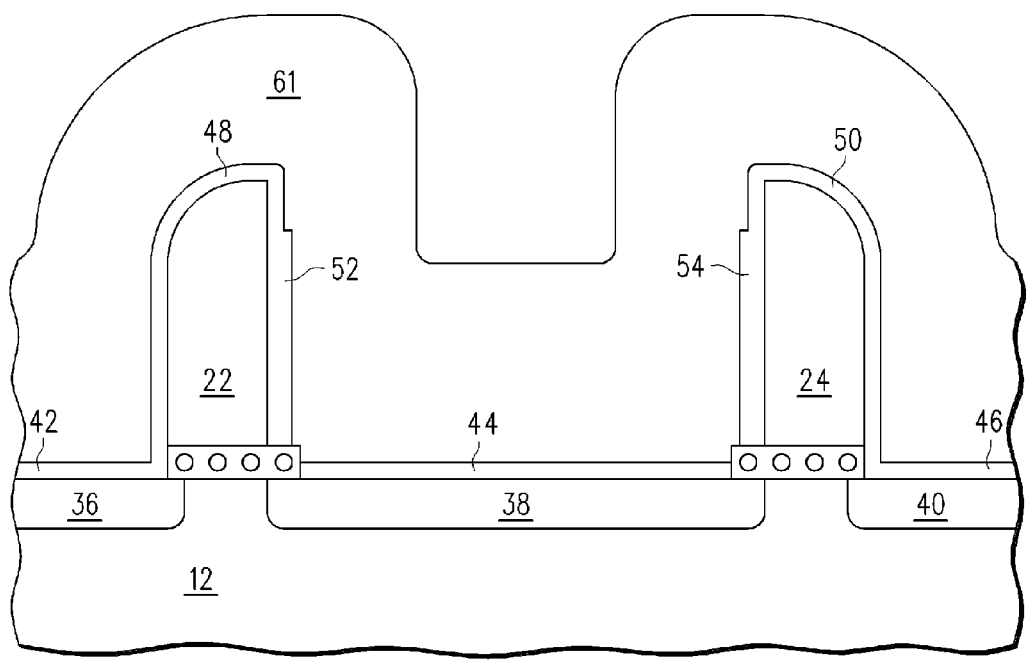
FIG. 12 illustrates the semiconductor device of FIG. 9 after forming the second conductive layer in accordance with one embodiment of the present invention.

FIG. 12 illustrates the semiconductor device 10 of FIG. 9 after forming the second conductive layer 61 that can be any material or formed by any process previously discussed.

Figure 13:
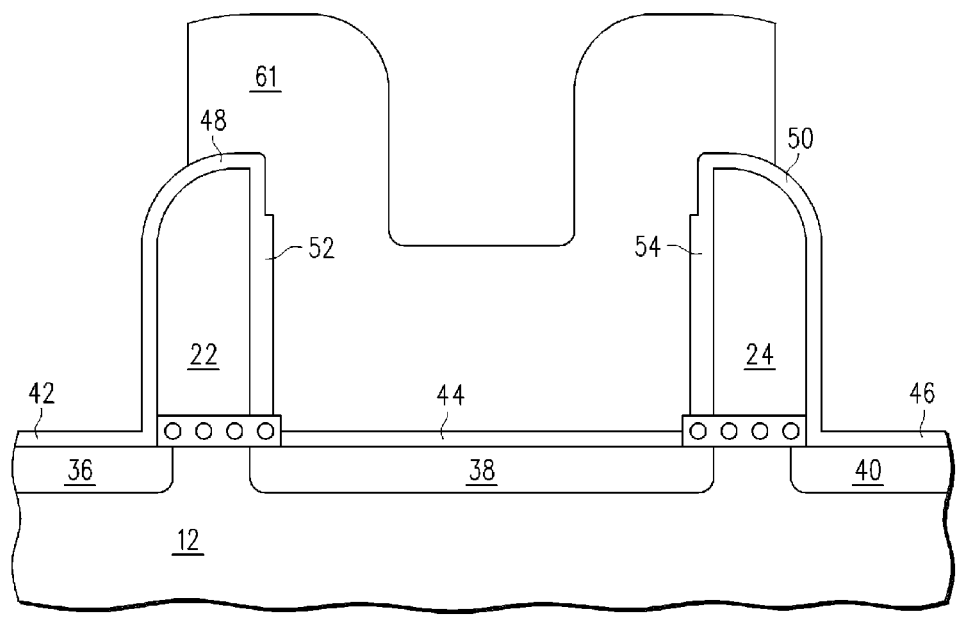
FIG. 13 illustrates the semiconductor device of FIG. 12 after patterning the second conductive layer in accordance with one embodiment of the present invention.

FIG. 13 illustrates the semiconductor device 10 of FIG. 12 after patterning the second conductive layer 61 in one embodiment. The second conductive layer 61 is patterned using a mask (e.g., photoresist) and any conventional chemistry to remove the second conductive layer 61 from areas over the dielectric regions 42 and 46. Afterwards, an anisotropic etch, as previously described, can be performed to form the second gates 56 and 58. During the anisotropic etch to form the second gates 56 and 58, an additional photoresist layer (not shown) may be formed in the areas over the dielectric regions 42 and 46 to protect these regions during the anisotropic etch. In this embodiment, by first patterning the second conductive layer 61, the spacers 60 and 62 will not be formed and hence, no processing is performed to remove them. Thus, after the anisotropic etch the semiconductor device 10 is the device in FIG. 11.

Figure 14:
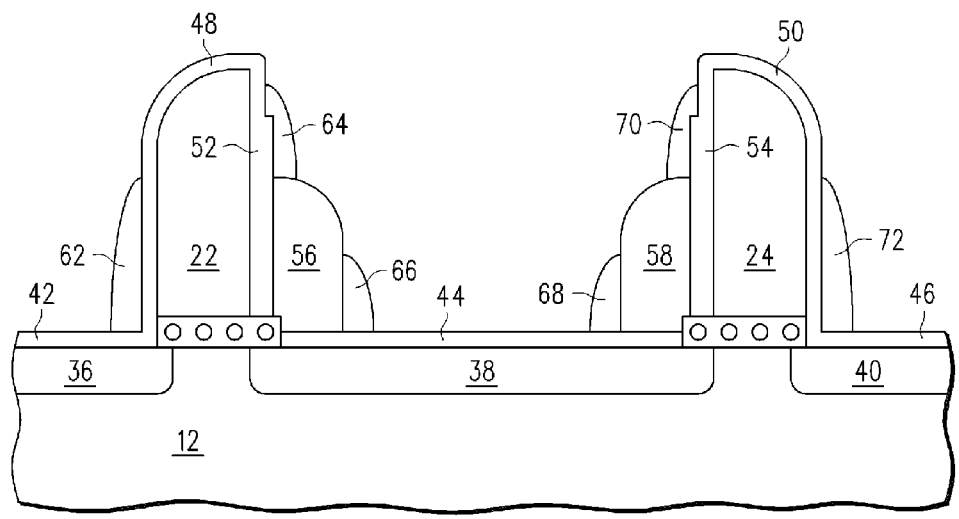
FIG. 14 illustrates the semiconductor device of FIG. 1 after forming additional spacers in accordance with one embodiment of the present invention.

FIG. 14 illustrates the semiconductor device 10 of FIG. 11 after forming additional spacers 62, 64, 66, 68, 70, and 72. The spacers 62, 64, 66, 68, 70, and 72 are formed during the same process. In one embodiment, a nitride layer is formed over the semiconductor device 10. In one embodiment, the nitride layer is silicon nitride and is approximately 600-approximately 900 Angstroms thick. The nitride layer can be formed by any suitable process, such as CVD, ALD, PVD, the like, and combinations of the above. After forming the nitride layer, an anisotropic etch using any chemistry previously discussed for etching a nitride layer can be used to form the spacers 62, 64, 66, 68, 70, and 72. The different heights of the spacers 62, 64, 66, 68, 70, and 72 are a function of the length of the element that the spacer is being formed next to. For example, spacer 62 is taller than spacer 66, because the first gate 22 is taller than the second gate 56.

Although not illustrated, a skilled artisan recognizes that an extension implant may be performed after forming additional spacers 62, 64, 66, 69, 70, and 72. In one embodiment, an extension implant of approximately 4E14 atoms/cm$^2$ of arsenic at approximately 25 KeV is used. In addition, a halo implant using approximately 1E13 atoms/cm$^2$ of boron at approximately 15 KeV may be used. Alternatively, another species can be used, such as phosphorus. A skilled artisan recognizes that if a different species is used the energy and dosage may change.

Figure 15:
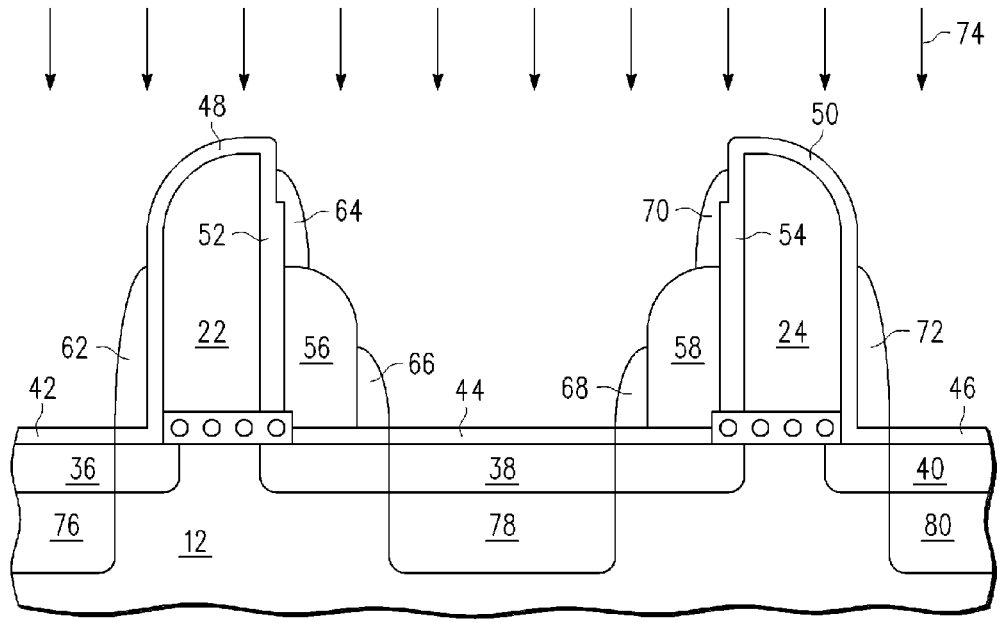
FIG. 15 illustrates the semiconductor device of FIG. 14 after forming the source/drain regions in accordance with one embodiment of the present invention.

FIG. 15 illustrates the semiconductor device 10 of FIG. 14 after forming the source/drain regions 76, 78, and 80. An implant 74 is performed using a species, such as arsenic. Arsenic can be implanted at an energy of approximately 30 KeV and a dosage of approximately 5E15 atoms/cm$^2$. Alternatively, another species can be used, such as phosphorus. A skilled artisan recognizes that if a different species is used the energy and dosage may change. The result of the implant 74 is the formation of the source/drain regions 76, 78, and 80 in the semiconductor substrate 12.

Figure 16:
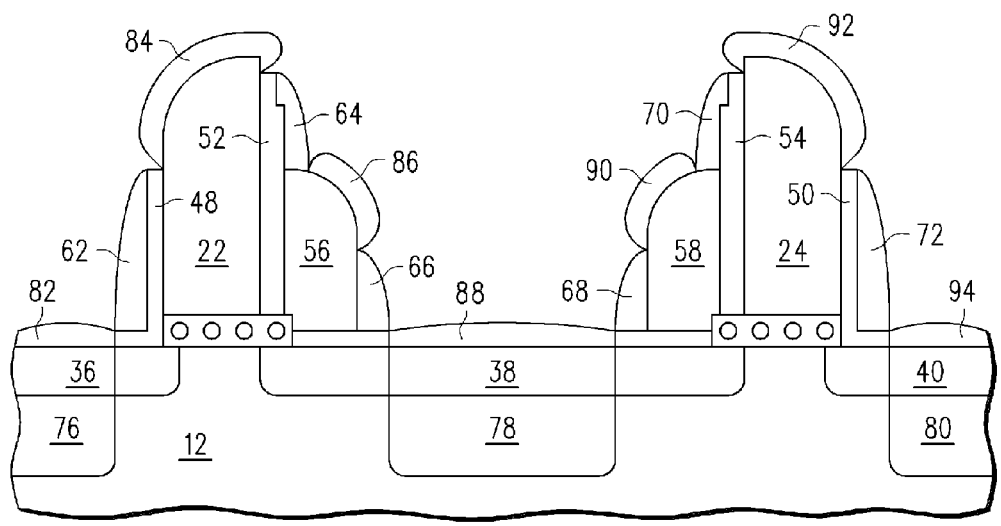
FIG. 16 illustrates the semiconductor device of FIG. 15 after forming silicide regions in accordance with one embodiment of the present invention.

FIG. 16 illustrates the semiconductor device 10 of FIG. 15 after forming silicide regions 82, 84, 86, 88, 90, 92, and 94. Before forming the silicide regions 82, 84, 86, 88, 90, 92, and 94, the dielectric regions 42 and 46 are removed. In addition exposed portions of the dielectric regions 44, 48 and 50 are also removed. The removal can occur using any conventional processing. After removing dielectric regions to expose silicon-containing regions, a salicidation process is performed. A metal layer (not shown) is formed over the semiconductor device 10. The metal layer can be any metal desirable to be used to form a silicide, such as platinum, another noble metal, transition metals, lanthanides, and actinides. The metal layer can be formed by any suitable process, such as a deposition process (e.g., chemical vapor deposition, atomic layer deposition, the like, and combinations of the above.) After forming the metal layer, an anneal is performed. Any conventional anneal can be used, such as a rapid thermal anneal (RTA). During the anneal the metal layer reacts with silicon in the areas where the metal layer is in contact with materials that include silicon. The reaction during the anneal creates silicide regions 82, 84, 86, 88, 90, 92, and 94. Silicide regions 84, 86, 90 and 92 are top portions of the gates 22, 56, 58, and 24, respectively. Silicide regions 82, 88, and 94 are top portions of the semiconductor substrate 12 and overlie the source/drain regions 76, 78, and 80, respectively. Skilled artisan recognizes that if the semiconductor substrate 12 does not include silicon then the dielectric regions 42 and 46 and the portions of the dielectric region 44 may not be removed; and if the first gates 22 and 24 do not include silicon the exposed portions of the dielectric layers 48 and 50 may not be removed. Furthermore, even if these portions or layers are removed, a silicide will not be formed if the underlying layers (semiconductor substrate 12 or the first gates 22 and 24 do not include silicon.) After forming the silicide regions 82, 84, 86, 88, 90, 92, and 94, portions of the metal layer that did not react to form a silicide are removed. Any conventional process can be used to remove the unreacted metal regions. Because the first gates 22 and 24 have heights that are greater than the second gates 56 and 58 when siliciding the first gates 22 and 24 and the second gates 56 and 58 the silicide will not bridge the first gates 22 and 24 with the second gates 56 and 58, respectively and thus short the gates together.

By now it should be appreciated that embodiments for forming a split gate cell where the control gates are formed before the select gates (a control gate first approach) is discussed. In other embodiments, the select gates may be formed prior to the control gates (a select gate first approach) as described below. The process flow is very similar. Because the layer under the select gate and control gate are different, the charge storage layer under the control gate and the dielectric layer under the select gate are formed at different times in the two embodiments (control gate first versus select gate first embodiments).

Figure 17:
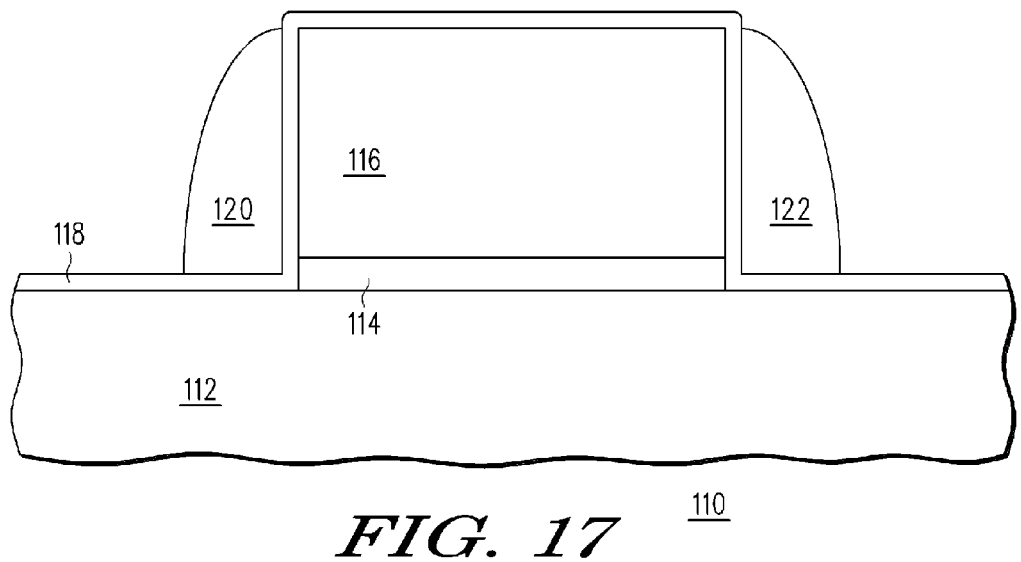
FIG. 17 illustrates the semiconductor device of FIG. 2 after forming a gate dielectric layer and first gates in accordance with one embodiment of the present invention.

FIG. 17 illustrates the semiconductor device 110 which is the semiconductor device 10 of FIG. 2 after forming a gate dielectric layer 118 and first gates 120 and 122, which are select gates in one embodiment. Semiconductor substrate 112 is equivalent to the semiconductor substrate 12, dielectric layer 114 is equivalent to the dielectric layer 14, and nitride layer 116 is equivalent to nitride layer 16. The gate dielectric layer 118 can be any suitable dielectric, such as silicon dioxide, formed by any suitable process, such as thermal growth, CVD, ALD, PVD, the like or combinations of the above. After forming the gate dielectric layer 118 the first gates 120 and 122 are formed by forming a first conductive layer that is similar to the second conductive layer used to form the second gates in FIG. 10 and anisotropically etching the first conductive layer (like the second conductive layer in FIG. 10).

Figure 18:
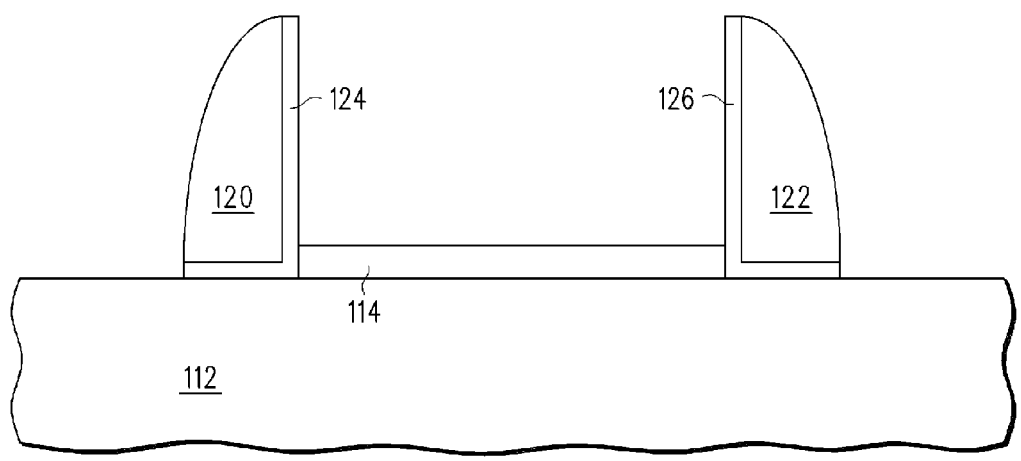
FIG. 18 illustrates the semiconductor device of FIG. 17 after removing the nitride layer and the exposed portions of the gate dielectric layer in accordance with one embodiment of the present invention.

FIG. 18 illustrates the semiconductor device 110 of FIG. 17 after removing the nitride layer 116 and the exposed portions of the gate dielectric layer. After removing the exposed portions of the gate dielectric layer, portions 124 and 126 of the gate dielectric layer remain. The nitride layer 116 may be removed using any chemistry previously discussed for removing the nitride layer 16 in FIG. 7 (e.g., a fluorine-containing chemistry.) In addition, this chemistry may be used to remove the exposed portions of the gate dielectric layer.

Figure 19:
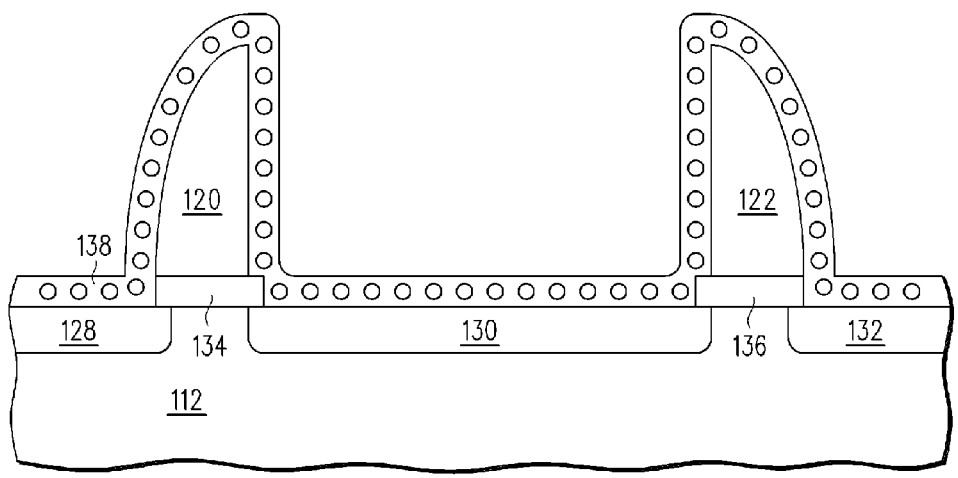
FIG. 19 illustrates the semiconductor device of FIG. 18 after forming implant regions and forming charge storage layer in accordance with one embodiment of the present invention.

FIG. 19 illustrates the semiconductor device 110 of FIG. 18 after forming implant regions 128, 130, and 132 and forming charge storage layer 138. In one embodiment, the implant is a self-aligned implant to correct for threshold voltage adjustment for the control gate that subsequently is formed. The implant can be skipped, if desired. The same implant conditions can be used as that previously discussed with respect to FIG. 9. The implant results in regions 128, 130, and 132 being formed in the semiconductor substrate 112.

Before forming the charge storage layer 138, the dielectric layer 114 is removed using conventional processing. Next, the charge storage layer 138 is formed using any process as previously described for the charge storage layer 18 formed in FIG. 3. In one embodiment, the charge storage layer 138 is removed from the vertical sidewalls of the first gates 120 and 122 because it is preferable not to have the nanocrystals between the first gates 120 and 122 (select gates) and the subsequently formed control gates. If such a process can be created, it would be desirable to use it here. However, without such a process it is acceptable to leave the nanocrystals between the select and control gates.

Figure 20:
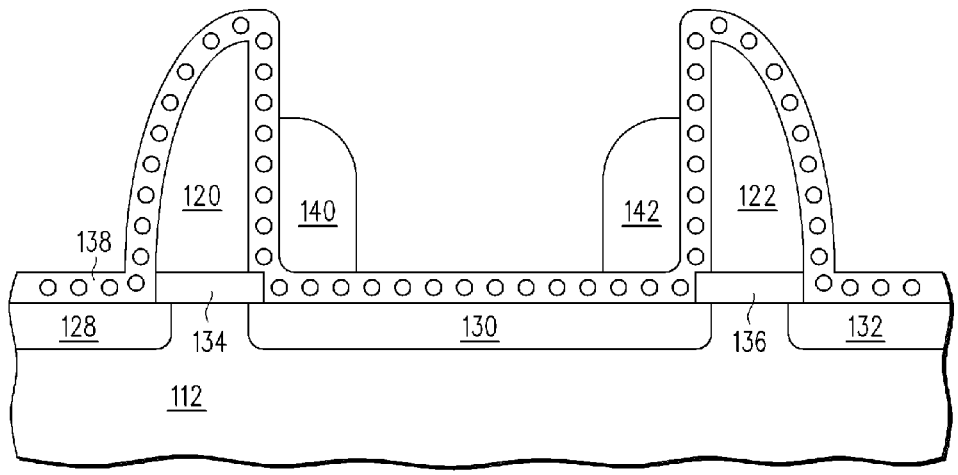
FIG. 20 illustrates the semiconductor device of FIG. 19 after forming the second gates in accordance with one embodiment of the present invention.

FIG. 20 illustrates the semiconductor device 110 of FIG. 19 after forming the second gates 140 and 142, which are control gates. As previously discussed, any process for forming the second gates 56 and 58 can be used to form the second gates 140 and 142.

Figure 21:
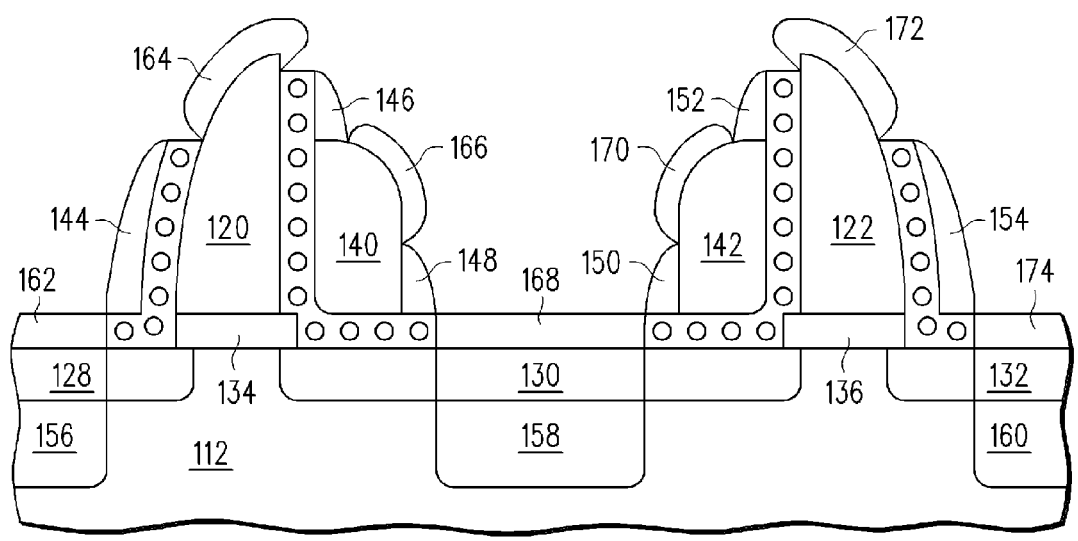
FIG. 21 illustrates the semiconductor device of FIG. 20 after forming spacers, source/drain regions, and silicide regions in accordance with one embodiment of the present invention.

FIG. 21 illustrates the semiconductor device 110 of FIG. 20 after forming spacers 144, 146, 148, 150, 152, and 154; source/drain regions 156, 158, and 160; and silicide regions 162, 164, 166, 168, 170, 172, and 174. The spacers 144, 146, 148, 150, 152, and 154 can be formed using the processes previously discussed for forming the spacers 62, 64, 66, 68, 70, and 72 as described with respect to FIG. 14. The source/drain regions 156, 158, and 160 can be formed using the processes previously discussed for forming the source/drain regions 76, 78, and 80 with respect to FIG. 15. The silicide regions 162, 164, 166, 168, 170, 172, and 174 can be formed using the processes previously discussed for forming the silicide regions 82, 84, 86, 88, 90, 92, and 94 with respect to FIG. 16. Because the first gates 120 and 122 have heights that are greater than the second gates 140 and 142 when siliciding the first gates 120 and 122 and the second gates 140 and 142 the silicide will not bridge the first gates 120 and 122 with the second gates 140 and 142, respectively and thus short the gates together.

By now it should be appreciated that there has been provided a method for forming a semiconductor device with a split gate, wherein the split gate includes a select gate and a control gate. Because the select gate and control gate are not lithographically defined, a decrease in the number of photolithography steps and masks is achieved. This increases cycle time and decreases cost. In addition, dimensions of the select gate and the control gate are not limited by photolithography using the processes described with reference to the figures. Furthermore, misalignment of the gates, which results in undesirable threshold voltage distributions, is prevented since photolithography is not used. As should also be understood based on the above description, the dielectric layer or charge storage layer that eventually is located under the first gate (either select or control gate) may used for the intergate dielectric and as an etch blocking layer. In addition, the nanocrystals may be removed in this intergate dielectric which minimized degradation of the device. Furthermore, the processes described above allow for a relatively thick dielectric to be formed between the control gate and select gate so that a high voltage can be applied to the control gate without causing breakdown.

As a skilled artisan understands, a control gate and a select gate do not store charge. In the semiconductor devices discussed above, the charge is stored in the charge storage layer, not in the control or select gates. This is in contrast to a floating gate which does store a charge.

In the foregoing specification, the invention has been described with reference to specific embodiments. However, one of ordinary skill in the art appreciates that various modifications and changes can be made without departing from the scope of the present invention as set forth in the claims below. For example, while two control gates and two split gates are shown in the figures, a skilled artisan recognizes that one or more control gates and one or more split gates may be present. In addition, the nanocrystals in the charge storage layer may be oxidized or may not be oxidized in any embodiment. Accordingly, the specification and figures are to be regarded in an illustrative rather than a restrictive sense, and all such modifications are intended to be included within the scope of the present invention.

Although the invention has been described with respect to specific conductivity types or polarity of potentials, skilled artisans appreciated that conductivity types and polarities of potentials may be reversed.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one.

What is claimed is:

1. A method for forming split gate memory cells using a semiconductor substrate, comprising:
   forming a sacrificial layer;
   patterning the sacrificial layer to form a sacrificial structure with a first sidewall and a second sidewall;
   forming a layer of nanocrystals over the semiconductor substrate;
   depositing a first polysilicon layer over the semiconductor substrate;
   performing an anisotropic etch on the first polysilicon layer to form a first polysilicon sidewall spacer adjacent the first sidewall and a second polysilicon sidewall spacer adjacent the second sidewall;
   removing the sacrificial structure to leave the first polysilicon sidewall spacer and the second sidewall spacer;
   depositing a second polysilicon layer over the first and second polysilicon sidewall spacers and the semiconductor substrate; and
   performing an anisotropic etch on the second polysilicon layer to form a third polysilicon sidewall spacer adjacent to a first side of the first polysilicon sidewall spacer and a fourth polysilicon sidewall spacer adjacent to a first side of the second polysilicon sidewall spacer.

2. The method of claim 1, wherein:
   the step of forming the layer of nanocrystals occurs before the step performing an anisotropic etch on the first polysilicon layer; and
   the step performing an anisotropic etch on the first polysilicon layer results in the first polysilicon sidewall spacer being over a first portion of the layer of nanocrystals and the second polysilicon sidewall spacer being over a second portion of the layer of nanocrystals.

3. The method of claim 2, wherein:
   the step of performing an anisotropic etch on the first polysilicon layer is further characterized by the first polysilicon sidewall spacer being a control gate of a first split gate memory cell and the second polysilicon sidewall spacer being a control gate of a second split gate memory cell; and
   the step of performing an anisotropic etch on the second polysilicon layer is further characterized by the third polysilicon sidewall spacer being a select gate of the first split gate memory cell and the second polysilicon sidewall spacer being a select gate of the second split gate memory cell.

4. A method of claim 1, wherein:
   the step of forming the layer of nanocrystals occurs after the step performing an anisotropic etch on the first polysilicon layer and before the step of performing an anisotropic etch on the second polysilicon layer; and
   the step performing an anisotropic etch on the second polysilicon layer results in the third polysilicon sidewall spacer being over a first portion of the layer of nanocrystals and the fourth polysilicon sidewall spacer being over a second portion of the layer of nanocrystals.

5. The method of claim 2, wherein:
   the step of performing an anisotropic etch on the first polysilicon layer is further characterized by the first polysilicon sidewall spacer being a select gate of a first split gate memory cell and the second polysilicon sidewall spacer being a select gate of a second split gate memory cell; and
   the step of performing an anisotropic etch on the second polysilicon layer is further characterized by the third polysilicon sidewall spacer being a control gate of the first split gate memory cell and the second polysilicon sidewall spacer being a control gate of the second split gate memory cell.

6. The method of claim 1, further comprising removing, prior to the step of performing an anisotropic etch on the second polysilicon layer, a first portion of the second polysilicon layer, the first portion being adjacent to a second side of the third polysilicon sidewall spacer.

7. The method of claim 1, wherein:
the step of performing an anisotropic etch of the first polysilicon layer is further characterized by the first and second polysilicon sidewall spacers having a first height; and
the step of performing an anisotropic etch of the second polysilicon layer is further characterized by the third and fourth polysilicon sidewall spacers having a second height lower than the first height.

8. The method of claim 7, further comprising siliciding top portions of the first, second, third, and fourth polysilicon sidewall spacers.

9. The method of claim 1, further comprising performing a threshold adjust implant after removing the sacrificial structure and before depositing the second polysilicon layer.

10. The method of claim 9, further comprising forming a gate dielectric on the substrate between the first and second polysilicon sidewall spacers after performing the threshold adjust implant.

11. The method of claim 10, wherein:
the step of forming a layer of nanocrystals results in nanocrystals on the first sides of the first and second polysilicon sidewalls; and
the step of forming the gate dielectric has the effect of removing the nanocrystals on the first sides of the first and second polysilicon sidewalls.

12. The method of claim 1, further comprising performing a source/drain implant after forming the third and fourth polysilicon sidewall spacers using the first, second, third, and fourth polysilicon sidewall spacers as masks.

13. The method of claim 11, further comprising forming, prior to performing the source/drain implant, a fifth sidewall spacer adjacent to the first polysilicon sidewall spacer, a sixth sidewall spacer adjacent to the third polysilicon sidewall spacer, a seventh sidewall spacer adjacent to the second polysilicon sidewall spacer, and an eighth sidewall spacer adjacent to the fourth polysilicon sidewall spacer, wherein the fifth, sixth, seventh, and eighth sidewall spacers function as masks for the source/drain implant.

14. The method of claim 1, wherein the step of forming a layer of nanocrystals is further characterized as forming a layer of tunnel oxide under the nanocrystals and a layer of control dielectric over the nanocrystals.

15. A method of forming a non-volatile memory cell having a control gate over a nanocrystal layer, a select gate, a source, and a drain, comprising:
forming a sacrificial structure over a substrate,
forming a first sidewall spacer as one of a group consisting of the select gate and control gate adjacent to a first side of the sacrificial structure;
removing the sacrificial structure;
forming a second sidewall spacer adjacent to and insulated from a first side of the first sidewall spacer functioning as one of group, different from the first sidewall spacer, consisting of the select gate and the control gate;
forming a nanocrystal layer at a location that is under one of a group consisting of the first sidewall spacer and the second sidewall spacer; and
implanting, using the first and second sidewall spacers as masks, to form the source and the drain.

16. The method of claim 15, wherein the step of forming the second sidewall spacer comprises:
forming a layer of polysilicon;
patterning the layer of polysilicon to remove a portion of the layer of polysilicon, wherein the portion is adjacent to a second side of the first sidewall spacer; and
performing an anisotropic etch of the layer of polysilicon after the step of patterning.

17. The method of claim 16, further comprising:
forming a dielectric layer on the substrate prior to forming the sacrificial structure;
performing a threshold adjust implant through the dielectric layer after removing the sacrificial structure;
removing the dielectric layer; and
forming a gate dielectric layer, wherein the gate dielectric layer is under the second sidewall spacer.

18. A method of forming a memory device structure, comprising:
providing a substrate;
forming a sacrificial structure over the substrate,
forming a first sidewall spacer of polysilicon of a first height adjacent to the sacrificial structure;
removing the sacrificial structure;
forming a second sidewall spacer of polysilicon adjacent to and insulated from a first side of the first sidewall spacer of a second height lower than the first height; and
forming a nanocrystal layer over the substrate at a time comprising one of a group consisting of a time before forming the first sidewall spacer and a time between the removing the sacrificial structure and the forming the second sidewall spacer.

19. The split gate memory cell of claim 18, further comprising forming a first silicide region on a top portion of the first sidewall spacer and a second silicide region on a top portion of the second sidewall spacer.

20. The method of claim 19 further comprising:
forming a third sidewall spacer, which is a dielectric, adjacent to the first sidewall spacer;
forming a fourth sidewall spacer, which is a dielectric, adjacent to the second sidewall spacer; and
performing a source/drain implant using the first, second, third, and fourth sidewall spacers as masks.

* * * * *